United States Patent
Ehmke et al.

(10) Patent No.: US 7,449,765 B2
(45) Date of Patent: Nov. 11, 2008

(54) SEMICONDUCTOR DEVICE AND METHOD OF FABRICATION

(75) Inventors: John Charles Ehmke, Garland, TX (US); James Norman Hall, Parker, TX (US)

(73) Assignee: Texas Instruments Incorporated, Dallas, TX (US)

(*) Notice: Subject to any disclaimer, the term of this patent is extended or adjusted under 35 U.S.C. 154(b) by 108 days.

(21) Appl. No.: 11/363,074

(22) Filed: Feb. 27, 2006

(65) Prior Publication Data

US 2007/0200222 A1   Aug. 30, 2007

(51) Int. Cl.
*H01L 23/10* (2006.01)
*H01L 21/48* (2006.01)

(52) U.S. Cl. ........................ 257/618; 438/456
(58) Field of Classification Search .......... 257/E21.087, 257/E21.088, 618; 438/456
See application file for complete search history.

(56) References Cited

U.S. PATENT DOCUMENTS

| | | | |
|---|---|---|---|
| 5,798,557 A | | 8/1998 | Salatino et al. |
| 5,915,168 A | | 6/1999 | Salatino et al. |
| 5,999,306 A | * | 12/1999 | Atobe et al. ............. 359/295 |
| 6,476,886 B2 | * | 11/2002 | Krusius et al. .............. 349/73 |
| 6,537,892 B2 | * | 3/2003 | Jordan et al. ............. 438/406 |
| 6,556,261 B1 | * | 4/2003 | Krusius et al. .............. 349/73 |
| 6,624,003 B1 | * | 9/2003 | Rice ........................... 438/106 |
| 6,822,326 B2 | * | 11/2004 | Enquist et al. ............. 257/729 |
| 6,852,926 B2 | * | 2/2005 | Ma et al. .................... 174/539 |
| 6,856,014 B1 | | 2/2005 | Ehmke et al. |
| 6,906,847 B2 | * | 6/2005 | Huibers et al. ............. 359/291 |
| 6,969,635 B2 | * | 11/2005 | Patel et al. .................. 438/107 |
| 7,164,199 B2 | * | 1/2007 | Tarn ........................... 257/705 |
| 7,203,394 B2 | * | 4/2007 | Wiegele et al. .............. 385/18 |
| 7,238,999 B2 | * | 7/2007 | LaFond et al. .............. 257/417 |
| 7,265,027 B2 | * | 9/2007 | Yang ........................... 438/456 |
| 7,348,193 B2 | * | 3/2008 | Ouyang ........................ 438/25 |
| 2002/0179921 A1 | * | 12/2002 | Cohn ........................... 257/99 |
| 2004/0087043 A1 | * | 5/2004 | Lee et al. ........................ 438/6 |
| 2004/0256719 A1 | * | 12/2004 | Lei .............................. 257/706 |
| 2005/0167795 A1 | * | 8/2005 | Higashi ....................... 257/678 |
| 2005/0258516 A1 | * | 11/2005 | Hong et al. ................. 257/659 |
| 2006/0001123 A1 | * | 1/2006 | Heck et al. .................. 257/528 |
| 2006/0163698 A1 | * | 7/2006 | Araki .......................... 257/620 |
| 2006/0220199 A1 | * | 10/2006 | Duboc et al. ................ 257/678 |
| 2007/0042527 A1 | * | 2/2007 | Tuckerman et al. ......... 438/106 |
| 2007/0297037 A1 | * | 12/2007 | Khonsari et al. ............ 359/290 |

* cited by examiner

*Primary Examiner*—Evan Pert
(74) *Attorney, Agent, or Firm*—W. James Brady, III; Frederick J. Telecky, Jr.

(57) ABSTRACT

A MEMS (micro electro-mechanical system) semiconductor device and a method for producing such a device. A preferred embodiment of the present invention comprises the a wafer having a continuous BCS (bondline control structure) surrounding a MEMS active area that is affixed to an interposer layer, which is in turn affixed to a cover to form a sealed cavity over the surface of the MEMS. To fabricate this device, a wafer is populated with MEMS devices. The BCS is formed in the same process step as a device structure, for example a spacer layer. The BCS remains, however, even if all or a portion of this spacer layer is removed. In this way when the reflecting surface of the MEMS device has been formed, an interposer layer may be mounted to the BCS using a filler-less adhesive, and a cover can likewise be affixed to the interposer layer.

19 Claims, 6 Drawing Sheets

SEMICONDUCTOR DEVICE AND METHOD OF FABRICATION

TECHNICAL FIELD

The present invention relates generally to the fabrication of electronic devices, and in particular is directed to a semiconductor device such as a MEMS device having an active area on the surface of a substrate and a cover that is mounted on the wafer to form an enclosed recess over the active area.

BACKGROUND

Micro-electromechanical system (MEMS) devices are used in a variety of applications such as in projection display systems or laser printers. As their name implies, these devices are very small and include a number of tiny electrically-controlled component parts. The size of MEMS devices is, of course, of great advantage because they take up very little space and consume very little power. MEMS devices are for speed and accuracy often made by automated or semi-automated processes. Note that in optical applications, such as those mentioned above, these devices are sometimes referred to as MEOMS (for micro electro-optomechanical systems). For convenience, the term MEMS will be used herein to describe both.

As might be expected, the very small components on MEMS devices are sometimes very fragile and subject to being easily damaged or degraded even in normal operation. For this reason, a protective cover is often employed even when the device is ultimately to be disposed in a relatively isolated location. This cover is designed to protect the components of the MEMS device from moisture and from deleterious materials, as well as from impact by other objects during assembly or operation. In the case of an optical MEMS device, the cover will normally be transparent, or at least clear enough to allow passage of the requisite amount of light. The cover is almost always a separate component, and must be securely mounted in such a manner so as to facilitate the function of the cover and of the device itself. As background for the present invention, an exemplary MEMS device will now be described in greater detail.

Figure 1:
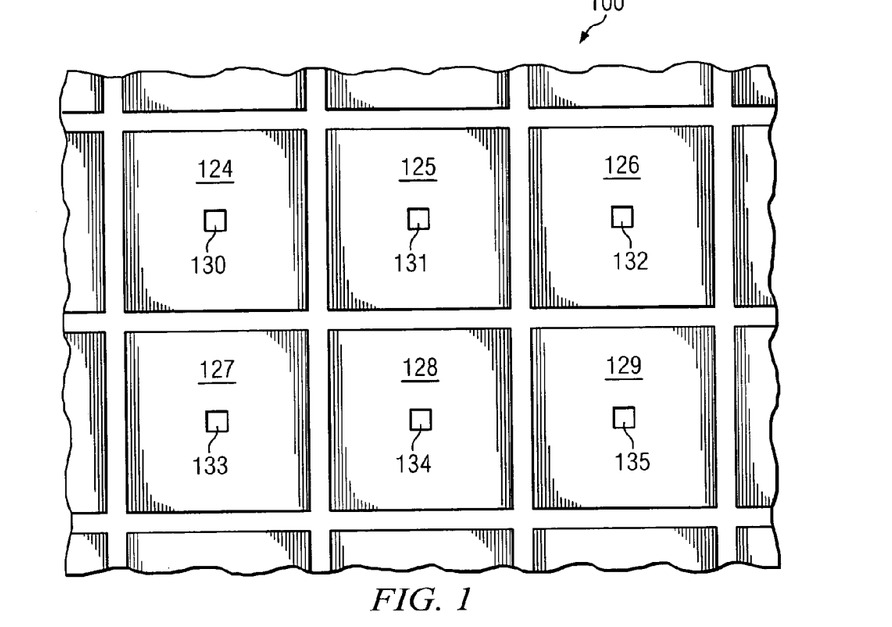
FIG. 1 is an aerial (plan) view of a portion of an exemplary MEMS device.

FIG. 1 is an aerial (plan) view of a portion of an exemplary MEMS device 100. In this example, the MEMS device is a DMD (digital micro-mirror device). The DMD is composed of a plurality of small, independently-movable mirrored surfaces (often referred to as micro-mirrors), numbered 124 through 129 in FIG. 1 (for convenience, the partially-shown micro-mirrors are not numbered). Each micro-mirror has a mirror via formed approximately in its center, and numbered, respectively, 130 through 135. The mirror vias are typically formed along with the mirror surface itself, and extend downwardly (into the view of FIG. 1) to connect the mirror surface to a hinge assembly disposed beneath (not shown). While only six micro-mirrors are (fully) shown in FIG. 1, a typical DMD may include on the order of thousands of them—even one million such structures or more. For convenience, the collection of micro-mirrors on MEMS device 100 will from time to time be referred to as the device's reflecting surface.

Figure 2:
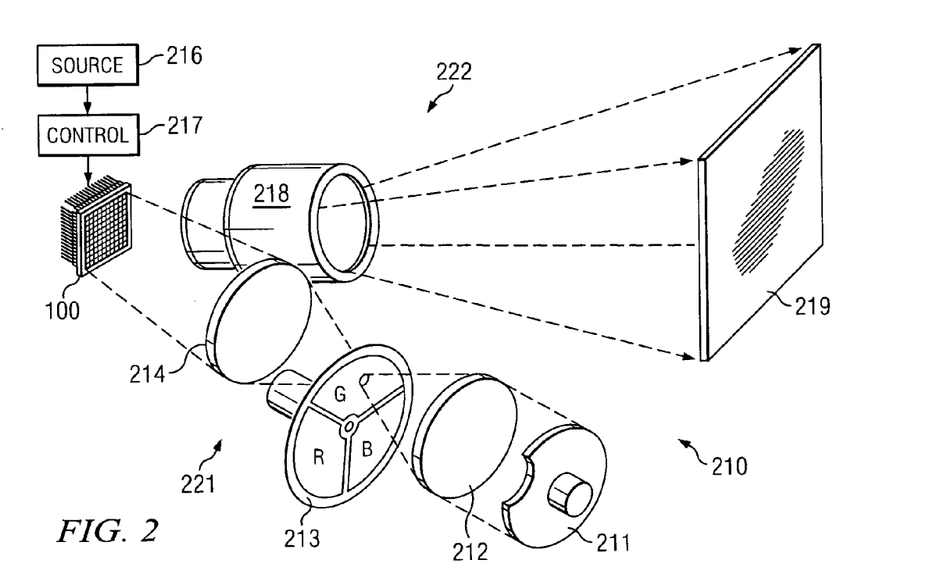
FIG. 2 is a simplified block diagram illustrating selected components of an optical system in which the MEMS device of FIG. 1 may be employed.

This MEMS device 100 of FIG. 1 may be part of, for example, the optical path of a projection display system. As an illustration, FIG. 2 is a simplified block diagram illustrating selected components of an optical path 210 in which the MEMS device 100 of FIG. 1 maybe employed. Briefly, light from a light source 211 is collimated and directed along a first portion 221 of the optical path 210. A color wheel 213 is used to produce selectively-colored light for creating colored images. The condenser lenses 212 and 214 shape the beam of light as it propagates along the first portion 221 of optical path 210. The selectively-colored light eventually falls on the MEMS device 100, where it is transformed into a visual image. The visual image created by MEMS device 100 is directed to a second portion 222 of the optical path 210, which includes a display screen 219. Display screen 219 presents the visual image display intended to be seen by the viewer and may be, for example, an HDTV screen. A projection lens 218 enlarges the image created by MEMS device 100 so it will fill the display screen 219.

MEMS device 100 creates these visual images by rapidly and selectively reorienting the individual mirrors formed on its reflecting surface (see FIG. 1). Each of these micro-mirrors is individually controllable to rapidly change orientation, which determines whether the mirror surface does or does not reflect light toward the second portion 222 of the optical path 210 (shown in FIG. 2). The operation of each of the micro-mirrors is governed by a controller 217 based on video information received from a video information source 216. Light not reflected toward the optical path second portion 222 may instead be directed toward a light dump (not shown) where, to avoid potential interference problems, it is absorbed rather than reflected. A protective cover may used to protect the reflecting surface of the MEMS device but, as should be apparent, any cover mounted over the micro-mirrors must be optically-suited to permit the passage of the incident and reflected light. In addition, it should be mounted in such a manner so as to provide optimal protection.

Figure 3:
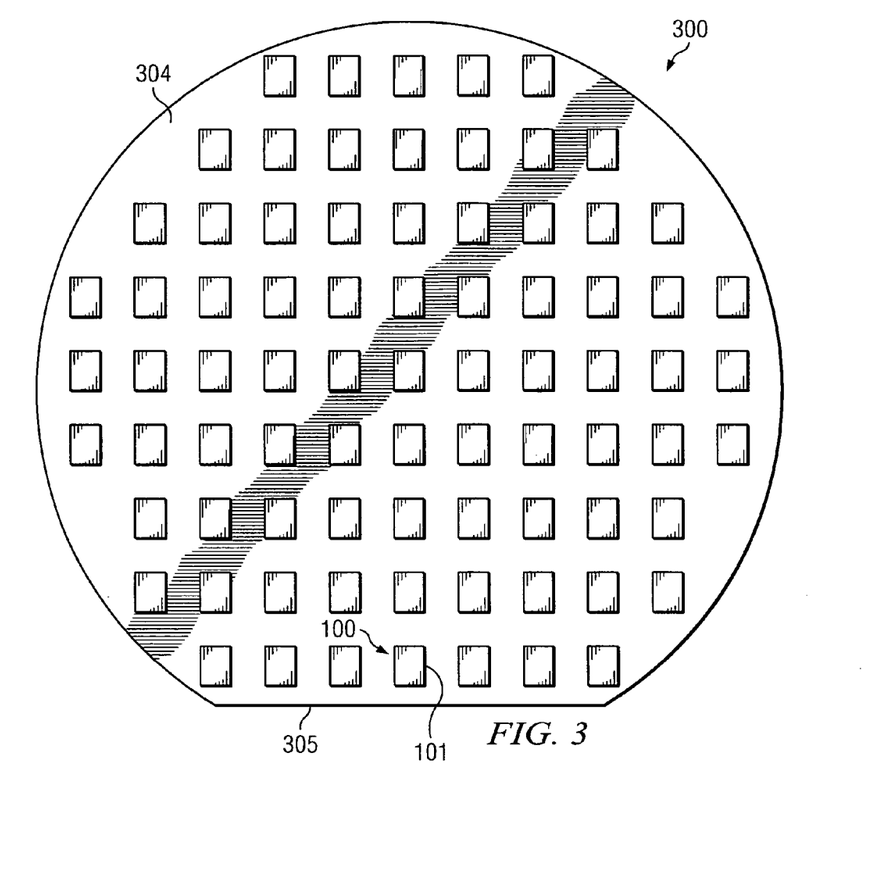
FIG. 3 is an aerial view of a semiconductor wafer populated with a number of MEMS devices.

The MEMS device 100 described above, or more precisely the main operational portion of it, is herein generally referred to as the active area. The MEMS device active area is often fabricated on a thin wafer of semiconductor material along with many identical or similar devices. FIG. 3 is an aerial view of a semiconductor wafer 300 populated with a number of MEMS devices. For purposes of illustration the MEMS device 100 has been generally labeled, although it is noted that further fabrication and assembly steps are performed before the MEMS device 100 forms part of an operational system such as optical path 210 illustrated in FIG. 2. The active area 101 of MEMS device 100 is, however, substantially defined at the illustrated stage of production. Active area 101 includes, in general, the individual micro-mirrors shown in FIG. 1, as well as the hinge assembly (not shown) on which they are able to reorient, and the electronics used to induce this movement (also not shown). Wafer 300, in this example, has a flat 305 used for properly positioning the wafer 300 during fabrication.

The MEMS device active area 101 is typically formed in a series of process steps. As should be apparent, these process steps are often performed for the entire wafer at roughly the same time and may include, for example, doping certain areas of the wafer 300, or depositing and selectively etching away material in a series of layers to form the components of the various devices in the active area 101. Such devices, and those in the active areas (shown but not numbered) of other devices formed on or near the surface 304 of wafer 300 may, in this example, include the micro-mirrors themselves, the underlying hinges, and the electronic circuitry used to induce mirror movement when the MEMS device 100 is in operation. When the MEMS device active area 101 has been formed, a protective cover (not shown in FIG. 3) may be added.

When such a cover is mounted, MEMS device 100 includes a closed recess or cavity between the cover and the surface of the active area, which recess is preferably sealed. The sealing is desirable because the introduction of moisture into the MEMS cavity may cause premature device degradation. Permeation does not normally occur through the substrate of course, or through the cover, but it can occur if the adhesive bonding these components is not properly applied. (And some permeation may occur through the adhesive itself.) In this regard, uniform bondline thickness is necessary for adhesive flow control. Fillers in the shape of, for example, rods or balls may be used for this purpose. Unfortunately, these fillers may cause pressure points to form when the components are assembled, and these pressure points may lead eventually to damage to the substrate. In addition, at least some permeation is likely to occur through the adhesive itself, even if it is ideally applied. Needed then, is an improved MEMS device that minimizes these disadvantages, or avoids them altogether. The present invention provides just such a solution.

SUMMARY OF THE INVENTION

These and other problems are generally solved or circumvented, and technical advantages are generally achieved, by preferred embodiments of the present invention which are directed to an electronic-device assembly, and to a method for making such a device.

In one aspect, the present invention is a wafer assembly including an active area formed on a substrate. The active area may include, for example, electronic circuitry forming a MEMS (micro electro-mechanical system) device such as a DMD (digital micro-mirror device). The active area is formed in a series of one or more process steps. In this aspect, a bondline control structure (BCS) is also formed on the wafer and is fabricated proximate to the active area. Preferably, the BCS is a linear structure extending outward from the surface of the wafer, and formed continuously about the active area. The BCS may be fabricated proximate, though not immediately adjacent to the active area, for example between the active area and an external connection site such as a bond-pad array. The wafer assembly, in this aspect, also includes a cover disposed over the active area. The cover preferably includes an interposer mounted to the wafer at the BCS, and a cover wafer mounted to the interposer to form a sealed recess adjacent the active area. In other embodiments, the cover wafer may be integrally-formed with the interposer. The wafer will preferably include a plurality of active areas, each associated with a separate device. In this case, a BCS is formed proximate each of the active areas, and the interposer forms a grid-like structure so that a recess is formed over each active area. The devices may then be separated for individual use.

In another aspect, the present invention is a method for fabricating a MEMS device that includes forming at least one active area on a substrate, forming a BCS peripheral to the at least one active area, and mounting a cover on the BCS to form a closed recess between the cover and the active area. The cover includes an interposer and a cover wafer, which may be integrally-formed with each other, but are preferably formed separately and then assembled. In a preferred embodiment, the cover wafer and interposer are assembled prior to mounting on the wafer. In an alternate embodiment, an adhesive is first applied to the wafer including to the BCS, and the interposer itself is mounted. In this embodiment, adhesive is then applied to the interposer and the cover wafer is mounted to the interposer.

An advantage of a preferred embodiment of the present invention is that a more adequate seal may be maintained about the recess formed adjacent to the active area of the electrical device, reducing the area through which moisture may permeate through the cover or interposer and the wafer on which the device is formed. This also eliminates the need for fillers in the adhesive, and as a consequence reduces or eliminates the stress-concentration areas that they might otherwise cause, leading to possible degradation of substrate integrity.

A further advantage of a preferred embodiment of the present invention is that if the BCSs are formed in-process, no additional fabrication process steps or materials are needed apart from those needed to form the device itself.

A more complete appreciation of the present invention and the scope thereof can be obtained from the accompanying drawings that are briefly summarized below, the following detailed description of the presently-preferred embodiments of the present invention, and the appended claims.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRTATIVE EMBODIMENTS

Presently preferred embodiments of the present invention and their implementation are discussed in detail below. It should be appreciated, however, that the present invention provides many applicable inventive concepts that can be embodied in a wide variety of specific contexts. The specific embodiments discussed are merely illustrative of specific ways to make use of the invention, and do not limit the scope of the invention.

The present invention will be described with respect to preferred embodiments in a specific context, namely a DMD (digital micro-mirror device)-type MEMS (micro electromechanical) device fabricated on semiconductor wafer. The invention may also be applied, however, to other, similar electronic devices and semiconductor structures as well.

In a preferred embodiment, the present invention is directed for use in a semiconductor device, and in particular, in a MEMS device that has a cover. The cover, which is preferably made of glass or a similar material, may be necessary, for example, where the MEMS device is a DMD that includes an optical component. This optical component includes a reflecting surface that includes a number of micro-mirror components that may be reoriented to selectively reflect received light. The micro-mechanical nature of this reflecting surface precludes simply depositing a protective sealing material. Instead, a glass cover spaced apart from the reflecting surface may be used so as to permit micro-mirror movement. The cover may include a recess formed over each of the MEMS devices to create this spaced-apart relationship, or may use an 'interposer' to create separation the cover from the MEMS surface, or may use both techniques. In either case the result is that a recess is formed between the reflecting surface and the cover. This recess is preferably sealed from the ambient environment to more fully protect the reflecting surface. Note that the active-area-bearing wafer, along with the cover mounted onto it and any interposer if fabricated as a separate component part, will be referred to herein as a wafer assembly.

The cover portion of the wafer assembly is typically mounted to the wafer using an adhesive. Adhesives, for example an epoxy, that are commonly used for this purpose often contain filler materials in the shape of, for example, rods or balls. These filler materials help separate the components of the wafer assembly in a spaced-apart relationship during the mounting process, but tend to give rise to pressure points that may damage or weaken the substrate. The thicker adhesive layer in essence created by these materials also tends to permit an undesirable amount of moisture to permeate from the surrounding environment into the sealed recess, leading to premature degradation of the device.

Figure 4:
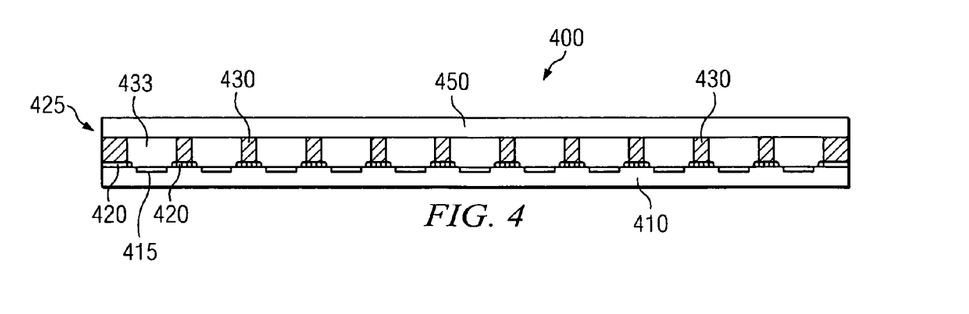
FIG. 4 is a cross-sectional elevation (side) view of a wafer assembly fabricated according to an embodiment of the present invention.

A preferred embodiment of the present invention is directed to an electronic device such as a MEMS device fabricated using a novel bondline control structure (BCS) that reduces or eliminates these negative effects. An embodiment of this invention will be introduced by reference to FIG. 4. FIG. 4 is a cross-sectional elevation (side) view of a wafer assembly 400 fabricated according to an embodiment of the present invention. In this embodiment, wafer assembly 400 includes a wafer 410 into which a number of MEMS device active areas such as active area 415 have already been formed (for clarity the remainder of the active areas, presumed in this embodiment to be substantially identical to active area 415, are not separately numbered). Note that FIG. 4 reflects a cross-sectional view of wafer 410 from the perspective of section line 4-4 shown in FIG. 5.

About active area 415 a bondline control structure (BCS) 420 has been formed. Preferably, BCS 420 was formed in-process, that is, during the process step or steps when one or more of the structures associated with MEMS device active area 415 were formed. The advantage of forming the BCS in-process, of course, is that no additional steps or materials need be added to the fabrication process. Naturally, such additional steps and materials may be used if for some reason otherwise desirable. In the embodiment of FIG. 4 each of the MEMS active areas is also surrounded by a BCS, similar to BCS 420, although these other BCSs are not separately numbered.

Figure 5:
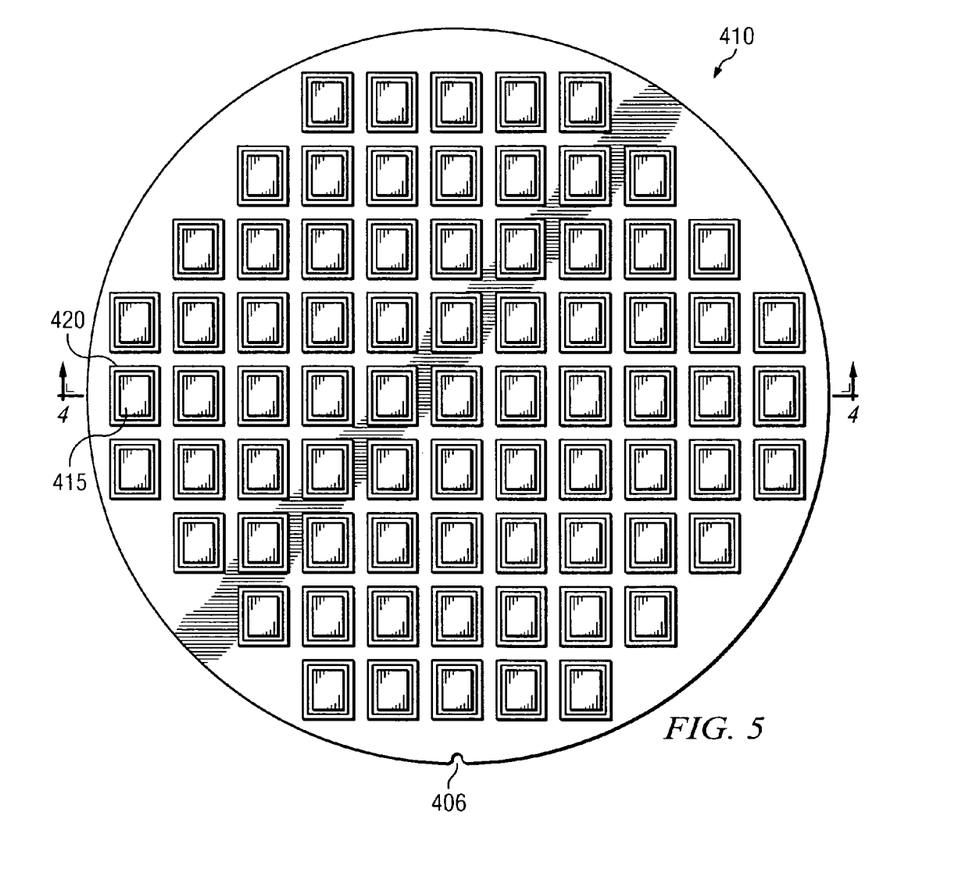
FIG. 5 is an aerial view of the wafer portion of the wafer assembly of FIG. 4, illustrating an exemplary location of BCSs formed about the active areas on the wafer according to an embodiment of the present invention.

FIG. 5 is an aerial view of wafer 410 illustrating an exemplary location of the BCSs formed about the active areas on the wafer surface. As can be seen in this view, BCS 420 is continuous about the active area 415. This continuity is preferred, though not required unless explicitly recited. In the embodiment of FIG. 5, a similar BCS has been formed about each of the active areas on wafer 410. Although again not required, this similar or identical formation of the BCS structures over the entire wafer is desirable and promotes proper mounting of the cover.

In the embodiment of FIG. 5, each of the BCSs is substantially identical with respect to each other, which is preferred though not required. In addition, it is not required that each BCS is substantially linear and continuous about its respective active area. Again, this configuration is preferred, but some breaks in the BCS may, for example, facilitate fabrication or assembly. Note, however, that any BCS discontinuity may result in lesser protection from moisture permeation and is for this reason not preferred. The BCSs are formed peripheral to their respective active area but are not necessarily immediately adjacent. In this regard, therefore, it is not essential to precisely identify which components are part of the active area and which are not. Normally, however, in a MEMS device such as a DMD having an optical surface including a plurality of micro-mirrors, the entire plurality of micro-mirrors will be considered part of the active area. In such an embodiment, there will usually be a number of bond pad sites (not shown) around the periphery of the active area as well. In most cases, they will be disposed outside of the BCS to facilitate external connections. Although in FIGS. 4 and 5 a single BCS is shown about the active area 415 (and each of the other active areas) there may well be others present. If present, these other BCSs may be inside or outside of the BCS 420 (and similar BCSs), and may be formed in variety of shapes and sizes (see, for example, FIG. 10).

Returning to FIG. 4, cover 425 includes an interposer 430 that is, in this embodiment, a structure that is fully formed apart from wafer 410 and then mounted thereto. This will often though not necessarily be the case. In this illustration aperture 433 is associated with active area 415. In other words, aperture 433 is formed so that when interposer 430 is mounted, light traveling to and from the reflective surface (or other aspect) of active area 415 is not unduly impeded. In this way, the interposer 430 forms a grid when viewed from above. Its thickness may vary according to the individual embodiment, but in wafer assembly 400 the grid members of interposer 430 form the sides of an enclosed recess associated with each MEMS active area. This relationship may be more clearly seen with reference to FIG. 6.

Figure 6:
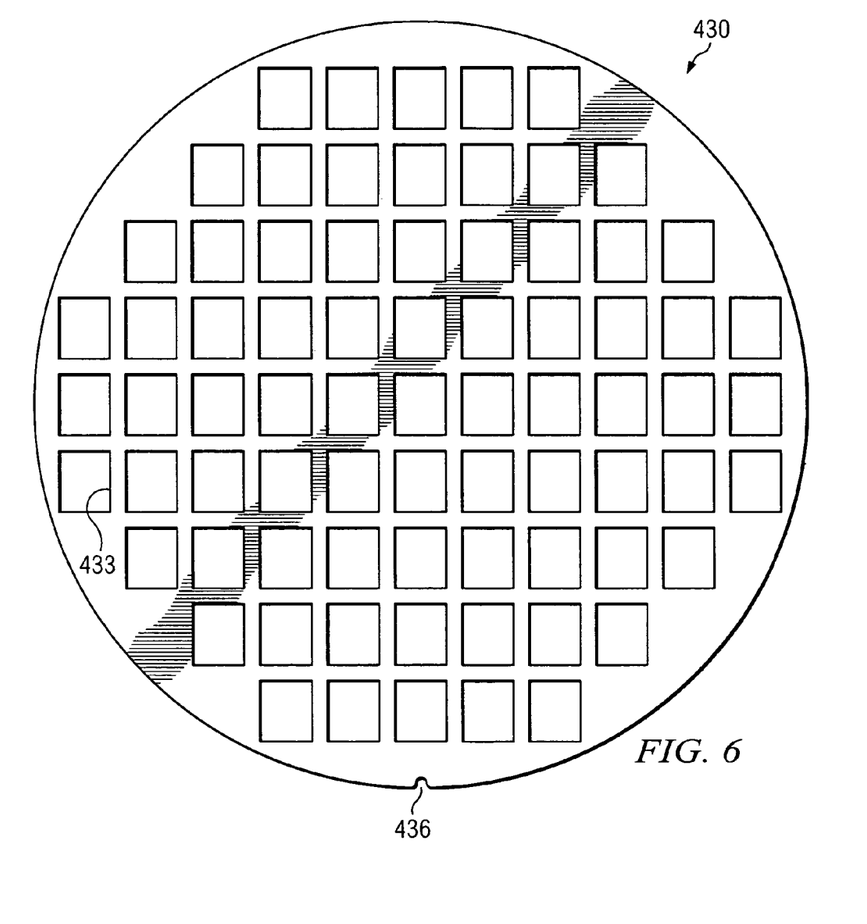
FIG. 6 is an aerial view of the interposer structure portion of the wafer assembly of FIG. 4 according to an embodiment of the present invention.

FIG. 6 is an aerial view of interposer structure 430 according to an embodiment of the present invention. The aperture 433 associated with active area 415 (see FIG. 5) is clearly visible in this view, along with the apertures associated with the other active areas of wafer 410. In this embodiment, an orientation notch 436 is formed in the edge of interposer 430 for the purpose of alignment when it is mounted onto the wafer. Note that each of the active areas of wafer 410 (shown in FIG. 5) is in this embodiment associated with an aperture. This commonality is preferred although not required.

Returning to FIG. 4, a cover wafer 450 is shown as a structure that is formed apart from interposer 430, as is preferable. In an alternate embodiment, the cover wafer and the interposer 430 are integrally-formed and assembled on the BCS-bearing wafer 410 as a unit. In the preferred embodiment, however, the separate cover wafer 450 is mounted to the interposer structure 430, and then the assembled cover 425 is mounted to the wafer 410. Note that the term 'cover' is used herein to refer to the structure mounted upon the wafer 410, including the interposer structure 430, while 'cover wafer' is employed to describe the top or outer portion of the cover 425. In the embodiment of FIG. 4, in other words, the cover 425 includes the interposer 430 and the cover wafer 450. This nomenclature is not necessarily standard but is employed herein so that a number of different cover-mounting strategies may be clearly described.

Figure 7:
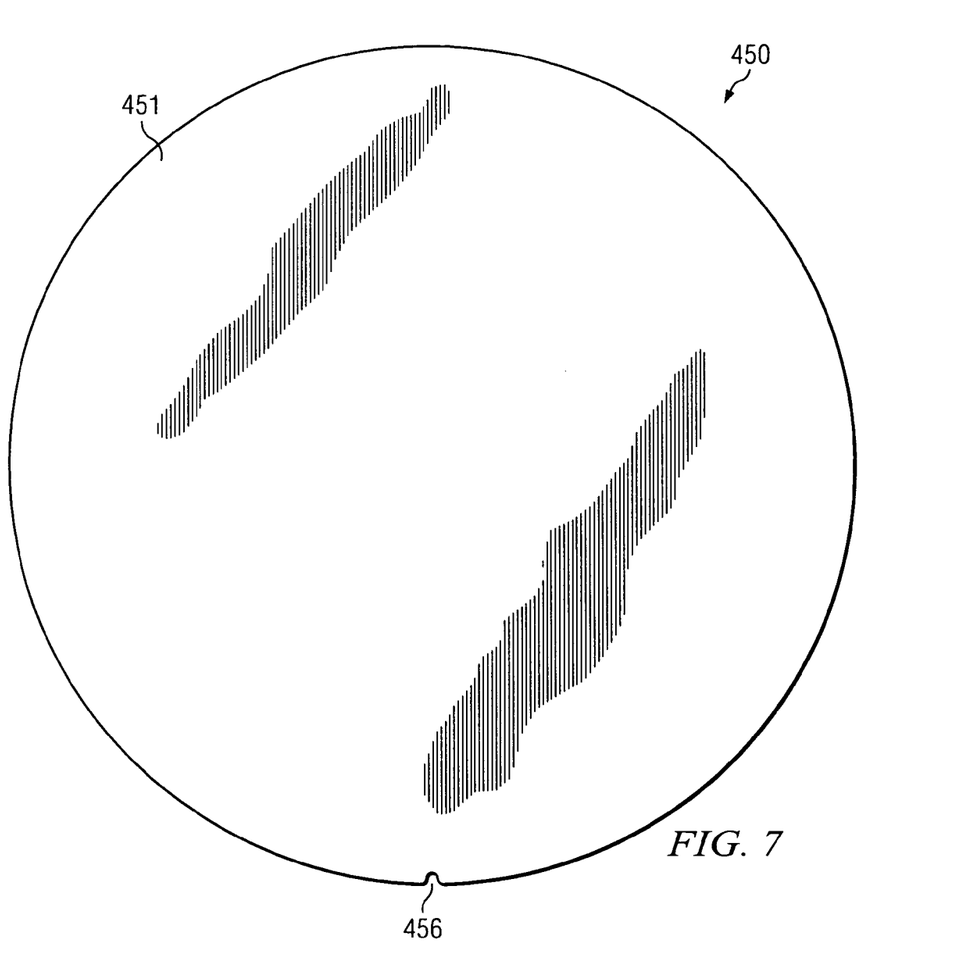
FIG. 7 is an aerial view of the cover wafer portion of the wafer assembly of FIG. 4 according to an embodiment of the present invention.

FIG. 7 is aerial view of cover wafer 450 according to an embodiment of the present invention. In this embodiment, cover wafer 450 includes a notch 456 for orientation during the assembly process. As with the other components of wafer assembly 400, of course, other fiducial features could be used instead of or in addition to notch 456. In the embodiment of FIG. 7, the cover wafer 450 is shown without any specific optical features, although in some embodiments it may generally have desirable optical characteristics. In an alternate embodiment (not shown), however, the cover wafer may, for example, include a number of aperture windows formed on or near the surface. In such an embodiment, an aperture window may correspond to a single MEMS device, such as active area 415 shown in FIG. 5. In another embodiment (also not shown), a plurality of such aperture windows may be associated with each MEMS device. Naturally, for a MEMS device such as a DMD, the wafer cover must permit the passage of light, but for embodiments in other applications the wafer cover may instead be opaque.

Again, it is noted that as the terms are used herein, the cover 425 is deemed to include the interposer 430 and the cover wafer 450. Returning to FIG. 4, with the mounting of the cover 425, an enclosed recess is formed above each of the MEMS active areas, for example the recess formed in part by aperture 433 associated with active are 415. As mentioned above, the finished device will function more properly and degrade more slowly if this enclosed recess remains sealed from the ambient environment. In accordance with this embodiment of the present invention, these advantages are promoted by mounting cover 425 onto the raised BCSs formed, and preferably formed in-process, on wafer 410. During assembly, an adhesive may be applied to the BCS or to the cover 425 or to both in order to securely bond them together. With the BCS structure formed as proposed, no fillers or filler materials are needed within the adhesive; eliminating their presence will help to avoid pressure concentration regions that may damage the substrate of wafer 410. In addition, the adhesive layer of the assembled structure will be much smaller (thinner) across the surface of continuous BCS features than is typical of conventional assemblies, advantageously discouraging moisture permeation.

Figure 8:
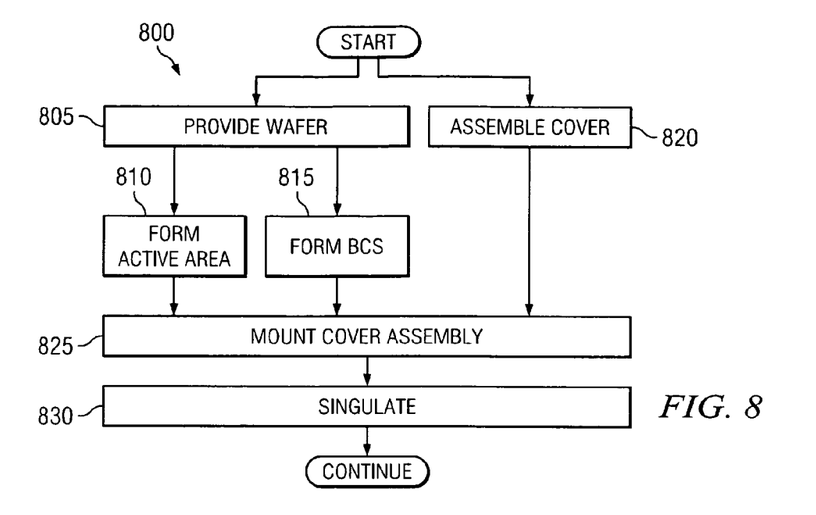
FIG. 8 is a flow diagram illustrating a basic method of fabricating a MEMS device according to an embodiment of the present invention.

FIG. 8 is a flow diagram illustrating a basic method 800 of fabricating a MEMS device according to an embodiment of the present invention. At START it is presumed that the materials and equipment required to perform the method 800 are available and operational. A wafer substrate is provided (step 805). In accordance with this embodiment, the method of the present invention is performed upon a typical semiconductor wafer made, of example of silicon. A plurality of active areas related to operation of the MEMS device may then be formed (step 810). This step in itself may require a series of process steps, but they are not separately shown in FIG. 8. Note that while a single MEMS device active area could be formed in this step, this would generally not be efficient and would not be typical absent exceptional circumstance, for example preparing a single device for testing or demonstration.

In accordance with this embodiment, a BCS associated with each MEMS device is also formed at this time (step 815). While the BCSs could be formed in a separate process step or steps, before or after the active-area formation, the greatest advantage of various embodiments of the present invention is gained when no additional process steps or materials are needed. For example, the BCS may be formed in the same layer as one forming a spacer layer associated with a DMD-type MEMS device. This layer, in one exemplary embodiment, may be formed of a deep UV hardened positive photoresist material. In this embodiment, the photoresist is preferably encapsulated in one or more metal layers. These metal layers may be added when other components, for example a hinge or micro-mirror layer is being deposited, or may be added in a separate step. The use of an encapsulating metal layer or layers has been found to enhance the moisture permeation resistance of the final structure. Other materials used in semiconductor fabrication may, of course, be used as well, and the BCS may alternately be formed at the same time as a non-spacer layer. In some embodiments, a one or more additional BCSs associated with each active area may be formed, either at the same time or at a different step.

In accordance with the embodiment of FIG. 8, each BCS is formed as a raised, linear structure running along or near the periphery of the active area. In other embodiments the BCS may include some discontinuity, but as mentioned above such a feature is not presently preferred. In the embodiment of FIG. 8, an interposer and a cover wafer are mounted together to form a cover assembly (step 820). After forming the cover assembly, and after the BCS and the active areas are formed in steps 810 and 815, respectively, the cover assembly is secured to the wafer at the BCS (step 825). The cover assembly is preferably mounted using an adhesive that does not contain solid filler materials that could create pressure points between the interposer and the wafer. The adhesive could be applied to either the wafer or to the interposer portion of the cover, or to both, prior to mounting, but this step is not separately shown. In an alternate embodiment (not shown), interposer may be mounted to the wafer (at the BCS) prior to mounting the cover wafer to the interposer.

The resulting structure will generally be the same as or similar to the one illustrated in FIG. 4 or the one partially illustrated in FIG. 9, described below. At this stage the wafer assembly may be singulated, a process where each of the individual devices now formed is separated from the others. Often certain testing steps will be performed first (or even earlier in the process) so that defective devices may be identified for repair or discard. Once separated, each of the individual devices may then be installed in a device such as the projection display system illustrated in FIG. 2 or some other system.

Figure 9:
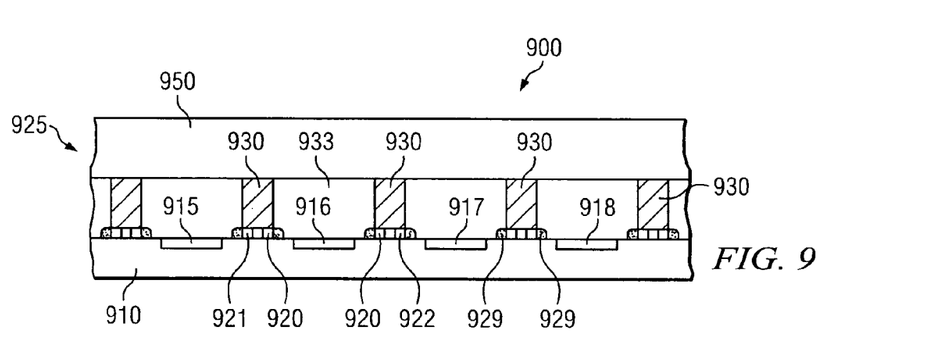
FIG. 9 is a cross-sectional elevation view of a portion of a wafer assembly formed according to an embodiment of the present invention.

FIG. 9 is a cross-sectional elevation view of a portion of a wafer assembly 900 formed according to an embodiment of the present invention. Wafer assembly 900 is similar though not necessarily identical to the wafer assembly 400 shown in FIG. 4, and only a portion of wafer assembly 900 is shown so that certain features may be illustrated more clearly. Wafer 910 is visible in this view and active areas 915 through 918 are fully shown. Interposer wafer 930 appears as a series of vertical members, which in this embodiment are cross-section views of grid members that extend into the view of FIG. 9. For clarity, not shown are the grid members of interposer 930 that are perpendicular to those appearing in FIG. 9. Also for clarity, only the features surrounding the active area 916 will be enumerated; in this embodiment the other, corresponding features nearer other active area are assumed to be similar or identical.

In this embodiment, active area 916 was formed on wafer 910 to make the operational portion of a MEMS device or similar structure. At the same time BCS 920 was formed proximate to, though not immediately adjacent to the active area. The BCS 921 is in this embodiment formed slightly above the wafer surface and is continuous about the active area 416. Other BCSs were formed about the other active areas, preferably in the same process step, for example BCS 921 associated with active area 915 and BCS 922 associated with active area 917. Each of these BCSs was preferably formed in-process. An adhesive 929 is applied to each BCS, and is visible in FIG. 9 adjacent the BCSs, for example BCS 920 and BCS 921. The area between the BCSs, however, preferably contains no adhesive, especially where structures such as bond pads (not shown) may later have to be accessed. Interposer 930 is mounted to the respective BCSs and is secured to them by the adhesive. Note again that the gaps between the BCSs and the interposer portion of the cover are relatively thin, discouraging moisture permeation. Recess 933 is enclosed at the top (as are the other similar recesses) by cover wafer 950, which in this embodiment is mounted to interposer 930 using an adhesive (not shown).

Figure 10:
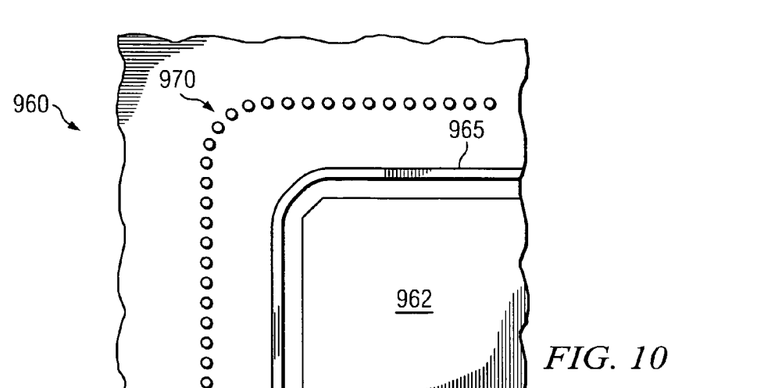
FIG. 10 is an aerial view of a portion of a semiconductor device, partially-formed in accordance with another embodiment of the present invention.

Another example is shown in FIG. 10. FIG. 10 is an aerial view of a portion of a semiconductor device 960 partially-formed in accordance with another embodiment of the present invention. FIG. 10 depicts only the corner of this device so that the relationship between the features may be more clearly seen. In this embodiment, active area 962 has been formed on wafer surface 961. Proximate to active area 962, a BCS 965 has been formed. Although not seen entirely in FIG. 10, BCS 965 extends continuously about the active area 962. A second BCS 970 (which is not continuous) has been formed to the outside of BCS 965 (when viewed from above), and is formed of a plurality of posts peripherally extending in a spaced apart relationship with respect to each other. As should be apparent, the BCS 965 will meet with the interposer (not yet mounted) and help form the desired seal about a recess that will be formed over active area 962. This advantage may be achieved to some extent even if the BCS 965 is not entirely continuous in nature, although continuity is preferred. The remaining BCS structures (such as BCS 970) may vary according to individual design characteristics. In addition, there is no requirement that BCS 965 lie inside the other BCS structures (if any) associated with active area 962.

Although preferred embodiments of the present invention and their advantages have been described in detail, it should be understood that various changes, substitutions and alterations can be made herein without departing from the spirit and scope of the invention as defined by the appended claims. For example, it will be readily understood by those skilled in the art that the relative dimensions shown in the preferred embodiments may be varied while remaining within the scope of the present invention.

Moreover, the scope of the present application is not intended to be limited to the particular embodiments of the devices and methods described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for fabricating a micro-electromechanical system (MEMS) device, comprising:
    forming at least one active area on a substrate;
    forming a bondline control structure (BCS) on the substrate peripheral to the at least one active area; and
    mounting a cover on the BCS to form a closed recess between the cover and the active area.

2. The method of claim 1, wherein mounting the cover comprises:
    mounting an interposer to the BCS; and
    mounting a cover plate to the interposer.

3. The method of claim 1, wherein mounting the cover further comprises applying an adhesive.

4. The method of claim 3, wherein the adhesive is applied to a portion of the cover.

5. The method of claim 3, wherein the adhesive is applied to at least a portion of the BCS.

6. The method of claim 1, wherein the cover is made of a clear glass material.

7. The method of claim 1, wherein the BCS is formed in process.

8. The method of claim 1, wherein the BCS forms a raised structure continuous about the active area interposer.

9. The method of claim 1, wherein the at least one active area comprises a plurality of active areas, and further comprising the step of singulating the covered substrate.

10. An electro-mechanical device, comprising:
    an active area formed on a substrate;
    at least one BCS formed on the substrate peripheral to the active area; and
    a cover mounted on the BCS.

11. The electro-mechanical device of claim 10, wherein the substrate is a semiconductor wafer.

12. The electro-mechanical device of claim 10, wherein the active area substantially forms the reflecting surface of a MEMS device.

13. The electro-mechanical device of claim 12, wherein the MEMS device is a digital micro-mirror device (DMD).

14. The electro-mechanical device of claim 10, wherein the at least one peripheral BCS is continuous about the active area.

15. The electro-mechanical device of claim 10, wherein the at least one peripheral BCS comprises at least a second peripheral BCS.

16. The electro-mechanical device of claim 10, further comprising a plurality of BCSs disposed outside of the at least one peripheral BCS.

17. The electro-mechanical device of claim 10, wherein the cover comprises an interposer for mounting to the at least one peripheral BCS.

18. The electro-mechanical device of claim 10, wherein the cover further comprises a cover wafer mounted to the interposer.

19. The electro-mechanical device of claim 10, wherein the at least one peripheral BCS is formed in-process.

* * * * *